(12) United States Patent
Uehling et al.

(10) Patent No.: US 9,324,667 B2
(45) Date of Patent: Apr. 26, 2016

(54) SEMICONDUCTOR DEVICES WITH COMPLIANT INTERCONNECTS

(75) Inventors: Trent S. Uehling, New Braunfels, TX (US); Lawrence S. Klingbeil, Chandler, AZ (US); Mostafa Vadipour, Phoenix, AZ (US); Brett P. Wilkerson, Austin, TX (US); Leo M. Higgins, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/350,098

(22) Filed: Jan. 13, 2012

(65) Prior Publication Data

US 2013/0181340 A1    Jul. 18, 2013

(51) Int. Cl.
*H01L 21/4763* (2006.01)
*H01L 23/00* (2006.01)

(52) U.S. Cl.
CPC .............. *H01L 24/03* (2013.01); *H01L 24/05* (2013.01); *H01L 24/11* (2013.01); *H01L 24/13* (2013.01); *H01L 24/16* (2013.01); *H01L 2224/036* (2013.01); *H01L 2224/0345* (2013.01); *H01L 2224/0347* (2013.01); *H01L 2224/03462* (2013.01); *H01L 2224/03914* (2013.01); *H01L 2224/0401* (2013.01); *H01L 2224/05124* (2013.01); *H01L 2224/05144* (2013.01); *H01L 2224/05147* (2013.01); *H01L 2224/05166* (2013.01); *H01L 2224/05572* (2013.01); *H01L 2224/05647* (2013.01); *H01L 2224/05655* (2013.01); *H01L 2224/1146* (2013.01); *H01L 2224/11472* (2013.01); *H01L 2224/11849* (2013.01); *H01L 2224/11906* (2013.01); *H01L 2224/13017* (2013.01); *H01L 2224/13018* (2013.01); *H01L 2224/13023* (2013.01); *H01L 2224/1357* (2013.01); *H01L 2224/13082* (2013.01); *H01L 2224/13083* (2013.01); *H01L 2224/13144* (2013.01); *H01L 2224/13147* (2013.01); *H01L 2224/13155* (2013.01); *H01L 2224/13564* (2013.01); *H01L 2224/13611* (2013.01); *H01L 2224/16237* (2013.01); *H01L 2224/73204* (2013.01); *H01L 2224/81191* (2013.01); *H01L 2224/81193* (2013.01); *H01L 2924/00014* (2013.01); *H01L 2924/10253* (2013.01)

(58) Field of Classification Search
CPC ............ H01L 21/4853; H01L 23/3128; H01L 21/4825; H01L 2224/04042; H01L 21/76873; H01L 21/76879; H01L 2224/0346; H01L 2224/35125; H01L 2224/35825
USPC .................. 438/612, 613, 618, 614; 257/737, 257/E23.178, 704, 741, 774, 782
See application file for complete search history.

(56) References Cited

U.S. PATENT DOCUMENTS

| | | | |
|---|---|---|---|
| 5,541,135 A | 7/1996 | Pfeifer et al. | |
| 6,350,695 B1 | 2/2002 | Tae et al. | |
| 6,429,531 B1 | 8/2002 | Mistry et al. | |
| 6,592,019 B2 | 7/2003 | Tung | |
| 6,826,827 B1 | 12/2004 | Fjelstad | |
| 6,917,119 B2 | 7/2005 | Lee et al. | |
| 7,407,877 B2 | 8/2008 | Kweon et al. | |

(Continued)

*Primary Examiner* — Jarrett Stark
*Assistant Examiner* — Shahed Ahmed

(57) ABSTRACT

A method forms a connecting pillar to a bonding pad of an integrated circuit. A seed layer is formed over the bond pad. Photoresist is deposited over the integrated circuit. An opening is formed in the photoresist over the bond pad. The connecting pillar is formed in the opening by plating.

11 Claims, 14 Drawing Sheets

(56) References Cited

U.S. PATENT DOCUMENTS

| | | | |
|---|---|---|---|
| 7,535,949 B2* | 5/2009 | Wang | H01S 5/423 372/101 |
| 2004/0007779 A1 | 1/2004 | Arbuthnot et al. | |
| 2005/0116340 A1 | 6/2005 | Shindo | |
| 2005/0275095 A1 | 12/2005 | Hussein et al. | |
| 2007/0020916 A1 | 1/2007 | Farnworth | |
| 2007/0077761 A1* | 4/2007 | Lehr | H01L 21/76802 438/687 |
| 2010/0219528 A1 | 9/2010 | Zhao et al. | |
| 2012/0043654 A1* | 2/2012 | Lu | C25D 5/10 257/737 |
| 2013/0009307 A1* | 1/2013 | Lu | H01L 24/13 257/738 |
| 2013/0075907 A1* | 3/2013 | Pang | H01L 24/11 257/741 |
| 2013/0127059 A1* | 5/2013 | Lai | H01L 23/488 257/773 |

\* cited by examiner

SEMICONDUCTOR DEVICES WITH COMPLIANT INTERCONNECTS

BACKGROUND

1. Field

This disclosure relates generally to semiconductor devices, and more specifically, to semiconductor devices or integrated circuits with compliant interconnects.

2. Related Art

With the introduction of low-k and ultra-low-k dielectrics in semiconductor manufacture, the effect of packaging stresses on the semiconductor die has increased dramatically. These brittle dielectric materials are sensitive to stresses imposed by the packaging. A major challenge in the industry is die dielectric delamination below the flip chip interconnect between the die and the package substrate. Because of the visual signal this delamination creates in scanning acoustic microscopy, this defect is termed "white bump". The stress contributing to "white bumps" originates from the difference in coefficients of thermal expansion between the silicon die and the package substrate, and the resulting deformation or bending of the interconnects during die attach solder reflow cooldown.

Currently, the interconnect can be a solder bump with thin Ni (less than or equal to 3 um) underbump metallurgy on the die side or a thick (greater than 20 um) Cu stud with a Sn-based solder cap. Both of these solutions are rigid enough to transfer a significant amount of stress to the die dielectric. The interconnect cross-sectional area must be large enough to provide acceptable life in spite of electromigration deterioration that occurs. This large area creates a rigid bump structure that is susceptible to packaging stresses.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices and methods are disclosed herein in which the cross-sectional area of a lower portion of an interconnect is reduced enough so that at least a portion of the interconnect accommodates stress imposed by the difference in thermal expansion between the die and the substrate to which it is connected through elastic or plastic deformation of the of the interconnect in the reduced cross-section, more compliant region in the interconnect during cool-down of the interconnect, while the top, or interface area is large enough to provide the required electromigration lifetime.

Figure 1:
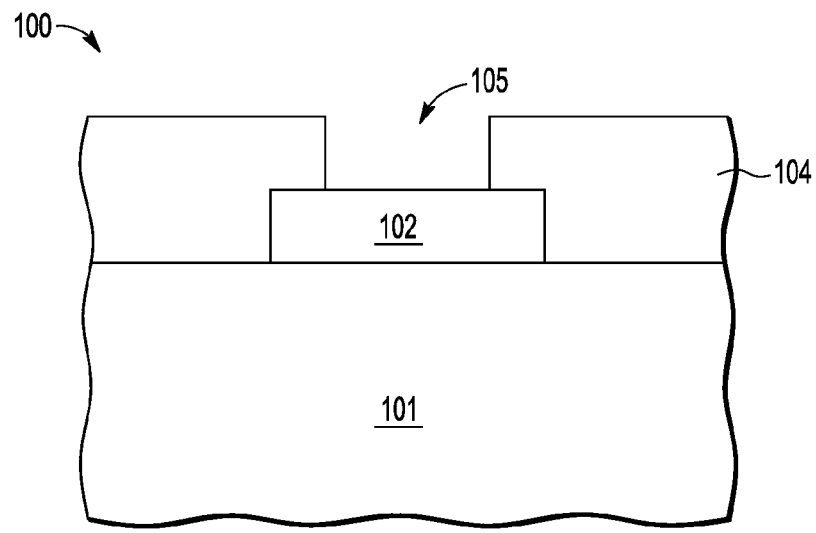
FIGS. 1-8 show an embodiment of a semiconductor device during subsequent stages of manufacture in accordance with the present invention.

FIGS. 1-8 show an embodiment of a semiconductor device during subsequent stages of manufacture in accordance with the present invention. FIG. 1 shows integrated circuit or semiconductor device 100 at an intermediate stage of manufacture during which bond pad 102 and final passivation layer 104 have been formed. An opening 105 is formed in passivation layer 104 over a central portion of bond pad 102. The sidewalls of opening 105 can have any suitable shape, such as straight up and down, concave, convex, or converging or diverging at the top or bottom of opening 105. Bond pad 102 can be formed using any suitable electrically conductive material such as aluminum, copper, or gold. Bond pad 102 is connected to structure 101 that includes one or more underlying metal interconnect and dielectric layers formed over a semiconductor substrate. Passivation layer 104 can be any suitable inactive, non-reactive material at any suitable thickness, such as a layer of silicon nitride formed by chemical vapor deposition from 0.5 to 1.5 microns thick, or a layer of polyimide formed using a spin-on process at a thickness of 0.5 to 7 microns thick, or a combination of silicon nitride and polyimide, or other materials known to be used for passivation layers.

Figure 2:
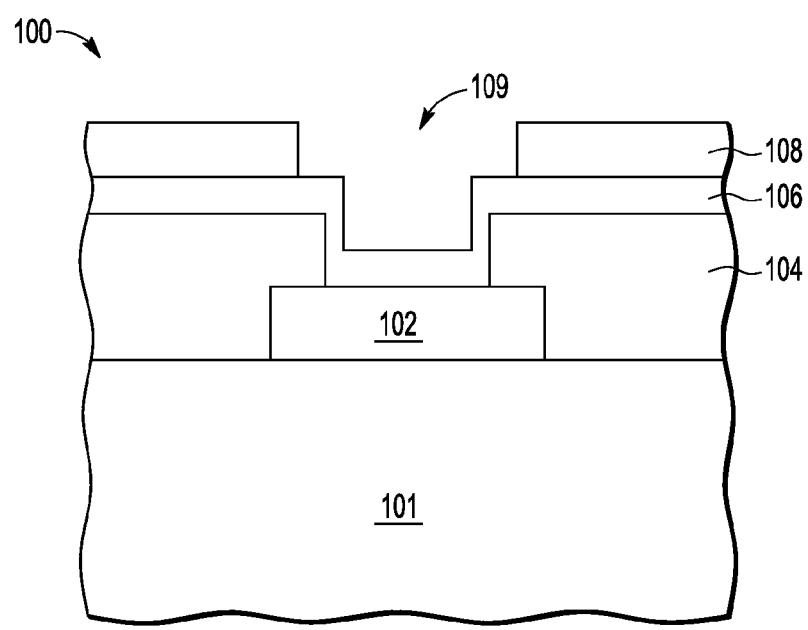

FIG. 2 shows semiconductor device 100 during a subsequent stage of manufacture during which seed layer 106 is sputtered over passivation layer 104 and at the bottom and around the sidewalls of opening 105 (FIG. 1). Seed layer 106 can include one or more layers of material. For example, seed layer 106 can be formed of a first layer of titanium typically ranging from 1000 to 5000 Angstroms in thickness and a second layer of copper typically ranging from 1000 to 5000 Angstroms in thickness. Alternatively, seed layer 106 can be formed by sputtering a first layer of titanium tungsten alloy ranging from 1000 to 5000 Angstroms in thickness and a second layer of copper ranging from 1000 to 5000 Angstroms in thickness. Other suitable layer thicknesses, materials or combination of materials can be used for seed layer 106.

Photoresist layer 108 is formed over seed layer 106 using dry film or a spin-on process at a thickness ranging from 5 to 20 microns. Other suitable formation or deposition techniques and thicknesses can be used for photoresist layer 108. Photoresist layer 108 is masked and etched to form opening 109 that is wider or larger in diameter than opening 105 (FIG. 1) in passivation layer 104. Note that any suitable type of photoresist material can be used for photoresist layer 108 including negative or positive photoresist material.

Figure 3:
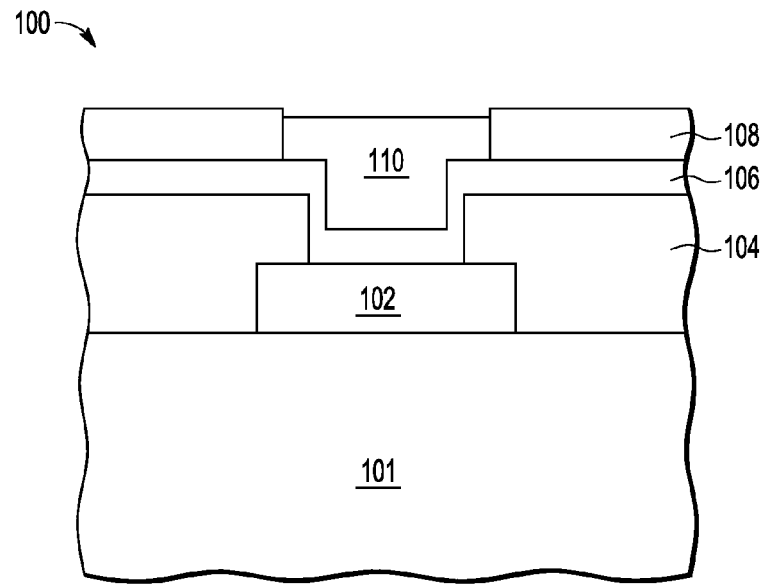

FIG. 3 shows semiconductor device 100 during a subsequent stage of manufacture during which initial plating 110 is formed in opening 109 (FIG. 2) using any suitable electroplating process. Any suitable material can be used for plating 110 such as copper or nickel. Plating 110 can be formed at a depth that is just below photoresist layer 108 to prevent the plating 110 from overflowing the sides of opening 109.

Figure 4:
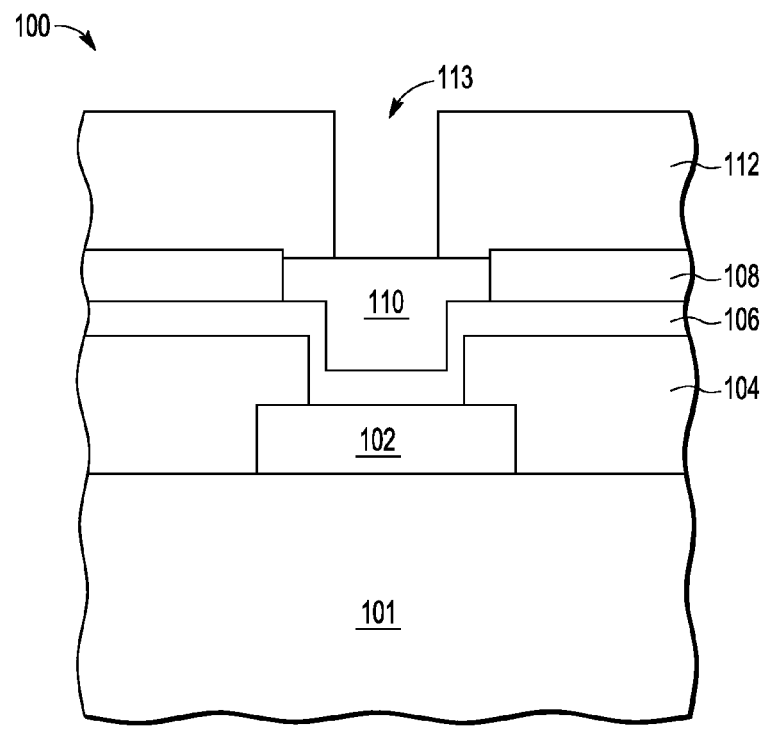

FIG. 4 shows semiconductor device 100 during a subsequent stage of manufacture during which photoresist layer 112 is formed over photoresist layer 108 and plating 110 using dry film or a spin-on process at a thickness ranging from 20 to 60 microns. Other suitable formation or deposition techniques and thicknesses can be used for photoresist layer 112. Photoresist layer 112 is masked and etched to form opening 113 that is more narrow or smaller in diameter than the immediately adjacent portion of plating 110 (FIG. 1) in photoresist layer 108. Note that any suitable type of photoresist material can be used for photoresist layer 112 including negative or positive photoresist material.

Figure 5:
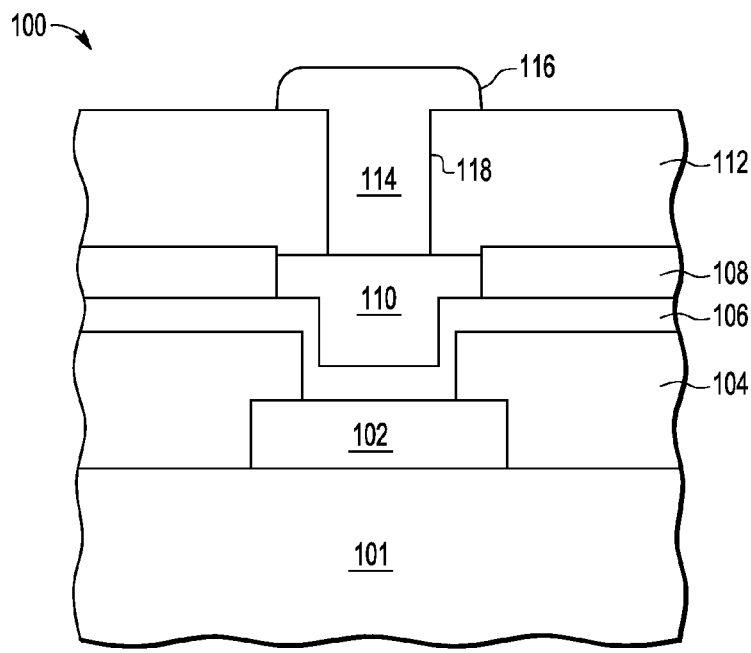

FIG. 5 shows semiconductor device 100 during a subsequent stage of manufacture in which final plating 114 is formed in opening 113 (FIG. 4) using any suitable plating process. Plating 114 can be formed to allow the plating 114 to overflow the sides of opening 113 to create a cap 116 over photoresist 112 around the edges of opening 113. Cap 116 is larger in width or diameter than compliant region 118 of final plating 114. The dimensions of opening 113 can be chosen to allow compliant region 118 of final plating 114 to flex, bend, or otherwise be compliant during subsequent stages of manufacture to avoid transfer of stress into the interconnect layers of the semiconductor device during solder reflow cool down after semiconductor device 100 is attached to a semiconductor package substrate.

Any suitable material can be used for plating 110, 114 such as copper, gold, or nickel.

Figure 6:
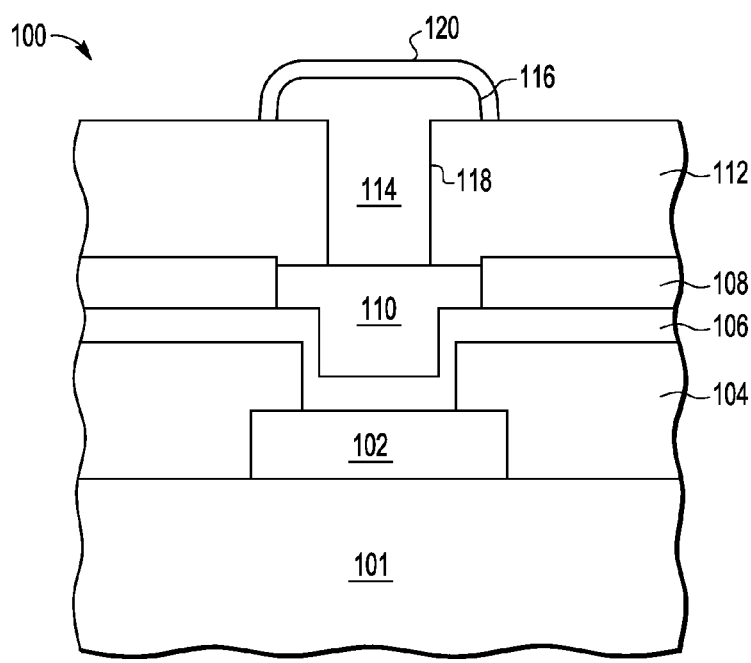

FIG. 6 shows semiconductor device 100 during a subsequent stage of manufacture during which solder finish 120 is formed over cap 116. Any suitable conductive solder material can be used for solder finish 120, such as a tin-silver material. Solder finish 120 can be used to attach device 100 to a semiconductor package substrate during a subsequent phase of manufacturing.

Figure 7:
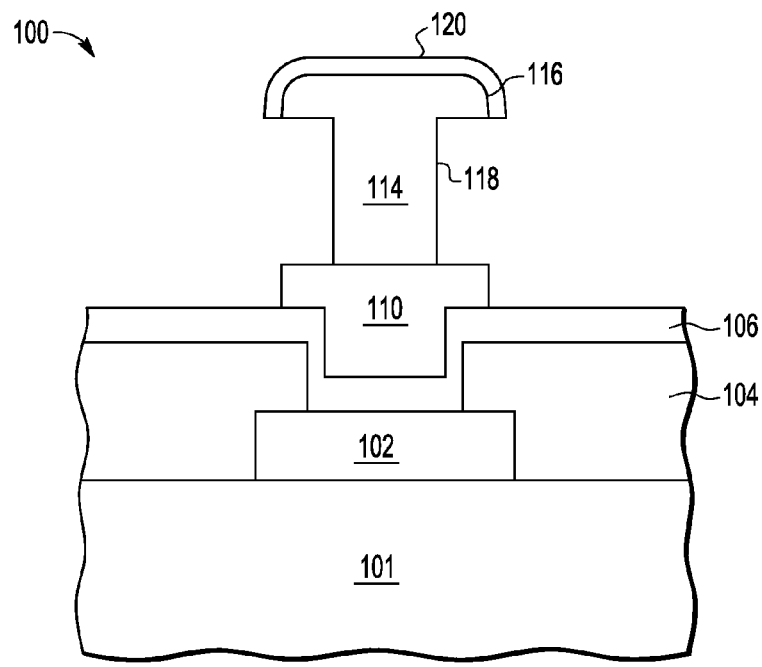

FIG. 7 shows semiconductor device 100 during a subsequent stage of manufacture in which photoresist layers 108, 112 are removed using any suitable technique such as a wet chemical process, a dry RF plasma process or a combination of both techniques.

Figure 8:
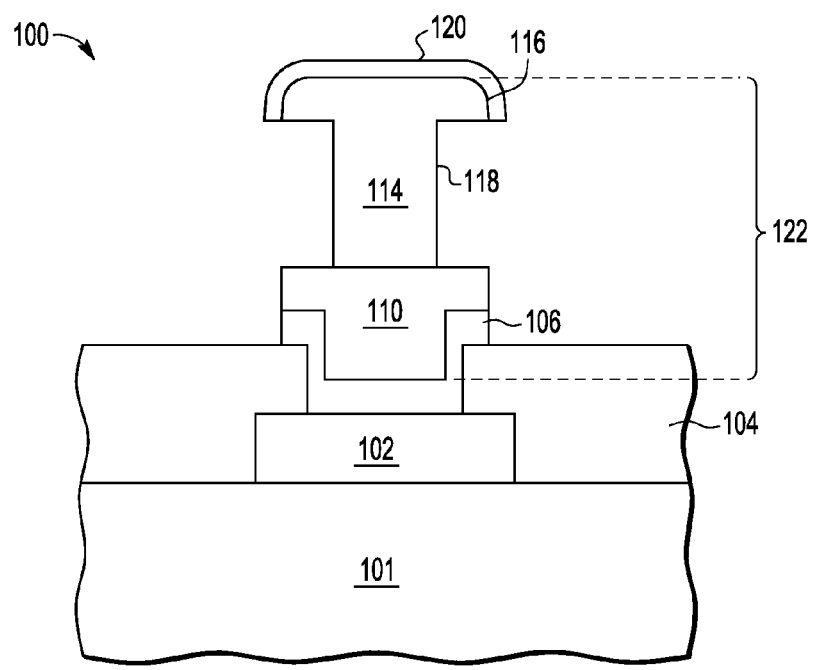

FIG. 8 shows semiconductor device 100 during a subsequent stage of manufacture during which seed layer 106 is removed from around the periphery of initial plating 110. Once the removal process is complete, seed layer 106 may undercut the edges of initial plating 110, but a substantial portion of seed layer 106 will remain between bond pad 102 and initial plating 110. Initial plating 110, compliant region 118, and cap 116 collectively form interconnect or pillar 122.

Figure 9:
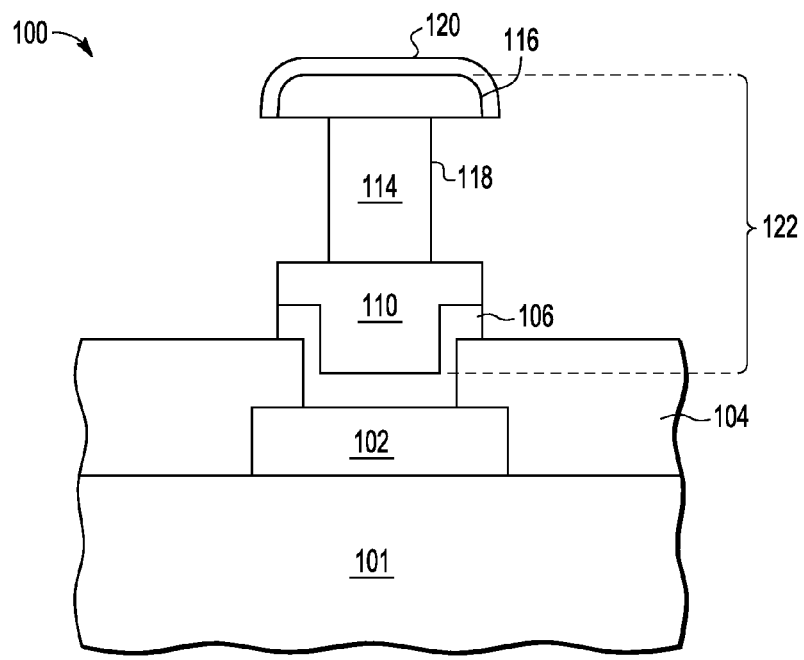
FIG. 9 shows another embodiment of the semiconductor device of FIG. 8 in which a cap is formed of a material that is different than the material used in a compliant region.

FIG. 9 shows another embodiment of semiconductor device 100 in which cap 116 is formed of a material that is different than the material used in compliant region 118. Additionally, the material used for plating 110 can be different than the material used for compliant region 118 and/or cap 116.

Figure 10:
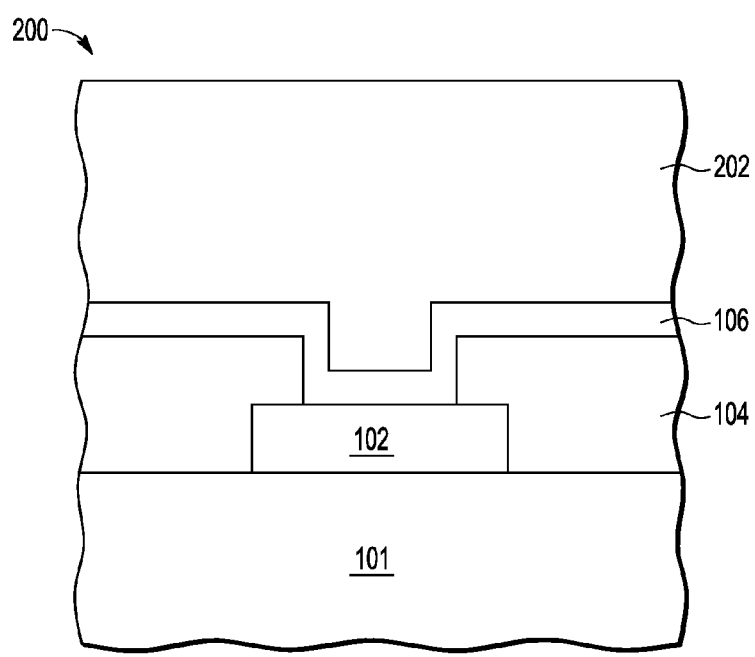
FIGS. 10-16 show another embodiment of a semiconductor device during subsequent stages of manufacture in accordance with the present invention.

FIGS. 10-16 show another embodiment of a semiconductor device 200 during various stages of manufacture in accordance with the present invention. FIG. 10 shows integrated circuit or semiconductor device 200 at an intermediate stage of manufacture during which bond pad 102, final passivation layer 104, and seed layer 106 have been formed using techniques similar to those described herein for semiconductor device 100.

Photoresist layer 202 is formed over seed layer 106 using dry film or a spin-on process at a thickness ranging from 20 to 100 microns. Other suitable formation or deposition techniques and thicknesses can be used for photoresist layer 202.

Figure 11:
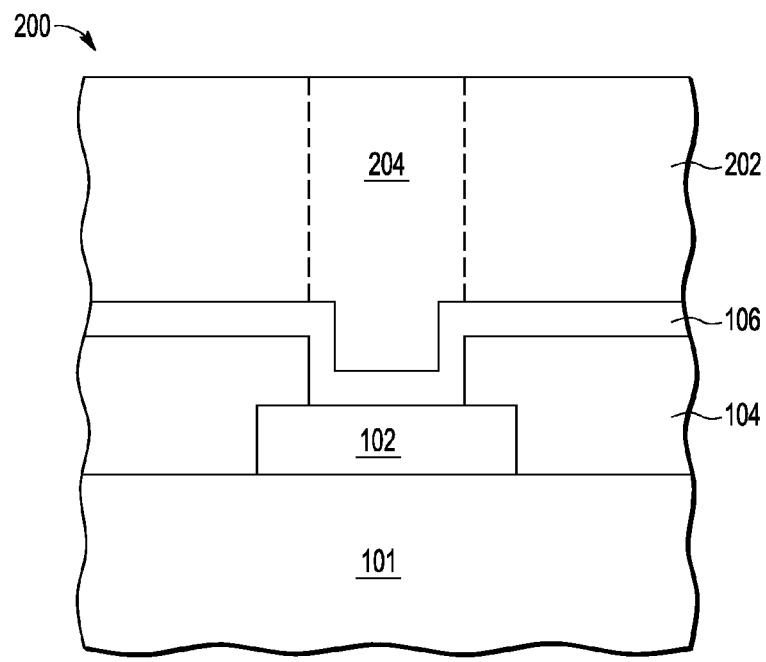

FIG. 11 shows semiconductor device 200 during a subsequent stage of manufacture during which a region 204 in photoresist layer 202 to be removed or etched is exposed. Region 204 has a larger width or diameter than opening 105 (FIG. 1) in passivation layer 104. Note that any suitable type of photoresist material can be used for photoresist layer 202 including negative or positive photoresist material.

Figure 12:
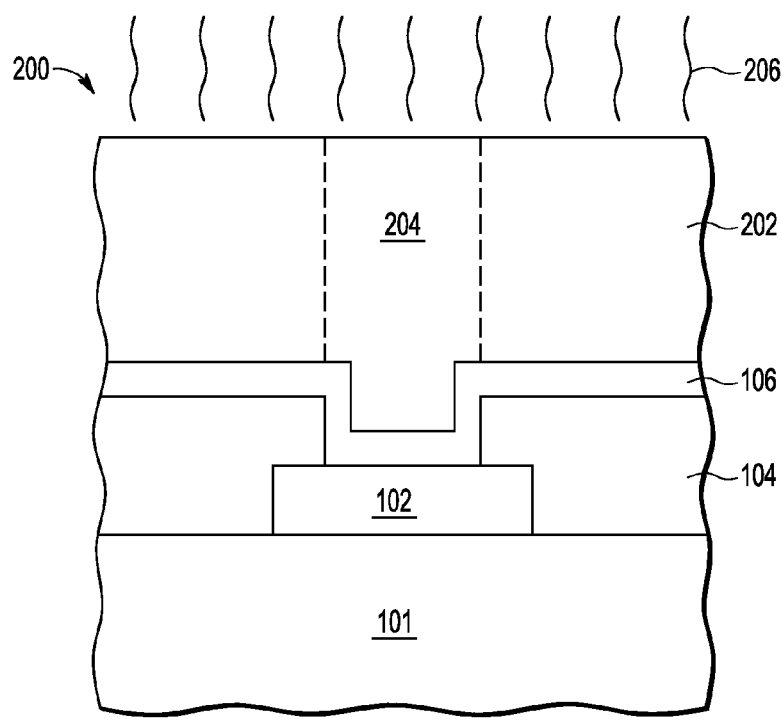
Figure 13:
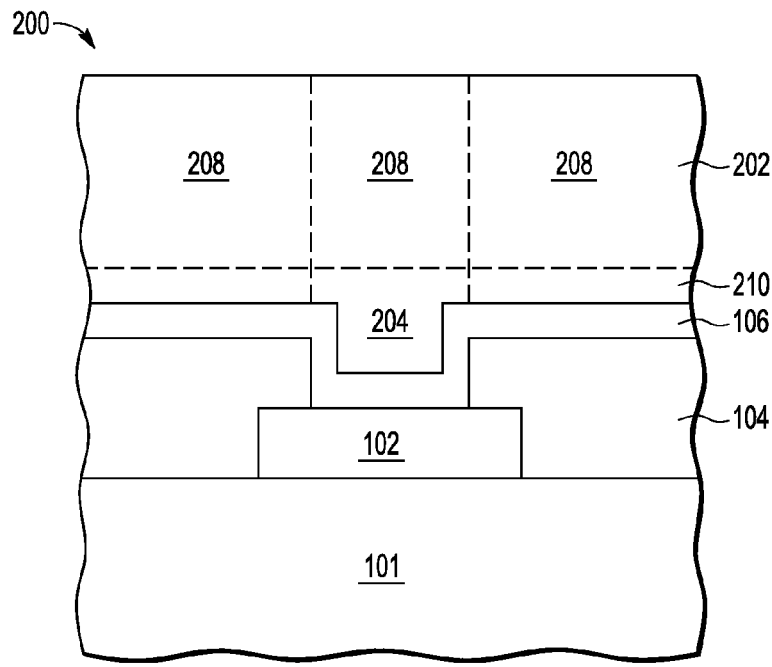

FIG. 12 shows semiconductor device 200 during a subsequent stage of manufacture showing the top surface of semiconductor device 200 is exposed to a hardening agent 206 such as chlorobenzene, or other suitable hardening agent. The hardening process can be tailored to produce hardened regions 208 as shown in FIG. 13 to a desired depth of photoresist layer 202. Photoresist layer 210 under hardened photoresist layer 202 includes unhardened photoresist regions surrounding exposed photoresist region 204, which is to be removed.

Figure 14:
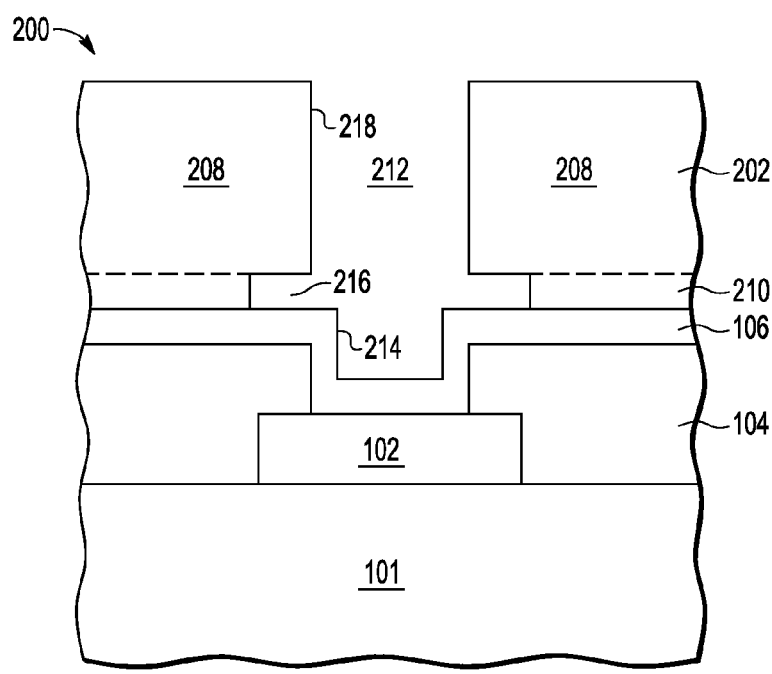

FIG. 14 shows semiconductor device 200 during a subsequent stage of manufacture during which photoresist layers 202, 210 are developed to form opening 212 by removing a hardened region 208 over exposed region 204, as well as region 204 itself. Note that a portion of unhardened photoresist layer 210 under remaining hardened photoresist regions 208 is removed during the stripping process, forming an undercut 216 in photoresist layer 210. The amount of undercut 216 can be selected to create a stable base for a compliant interconnect to be formed in opening 212. Thus, opening 212 can include several sections, for example, a lower section 214 adjacent seed layer 106 having the smallest width or diameter, undercut section 216 in photoresist layer 210 having the largest width or diameter, and an upper section 218 in photoresist layer 202 having an intermediate width or diameter compared to section 214 and section 216.

Figure 15:
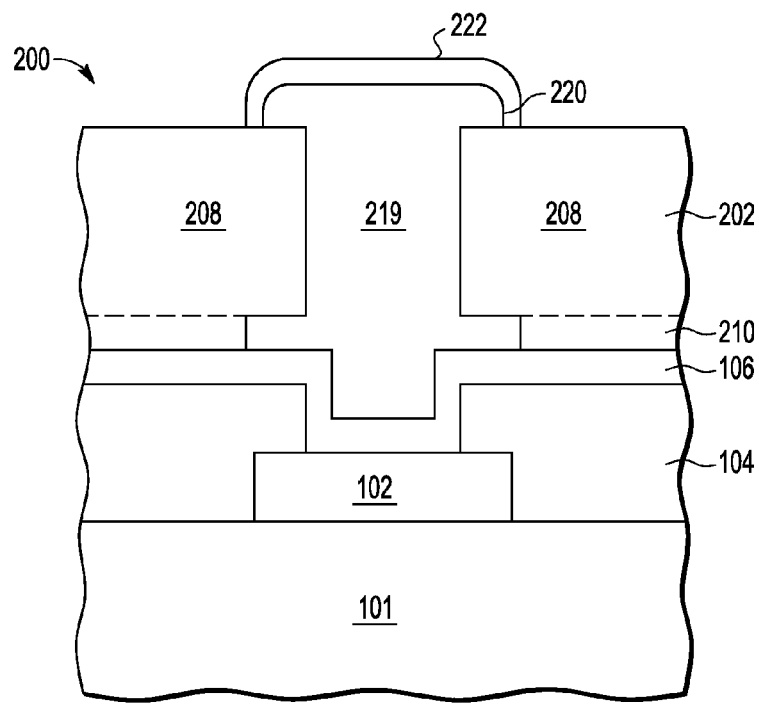

FIG. 15 shows semiconductor device 200 during a subsequent stage of manufacture in which compliant interconnect 219 has been formed in opening 212 (FIG. 14). Interconnect 219 is formed of any suitable conductive material or combination of conductive materials, such as copper, nickel, and/or gold. In some embodiments, interconnect 219 is formed flush with or slightly below the top of photoresist layer 202. In other embodiments, interconnect 219 is formed with a cap 220 that extends over a portion of the top of hardened photoresist regions 208. Cap 220 may be formed with dimensions suited to establishing a conductive bond with another component mounted adjacent to interconnect 219. In some embodiments, a solder finish 222 is formed over and around the sides of cap 220. In embodiments where interconnect 219 is flush with or slightly under the top of photoresist layer 202, solder finish 222 may still be formed over the top of interconnect 219 and may further extend over a portion of the top of hardened photoresist regions 208. If interconnect 219 is flush with or slightly under the top of photoresist layer 202, and solder finish 222 is plated over the top of interconnect 219, after stripping the photoresist layer 202 and reflowing the solder finish 222, interconnect 219 will not have a cap 220 of larger diameter than the interconnect 219.

Figure 16:
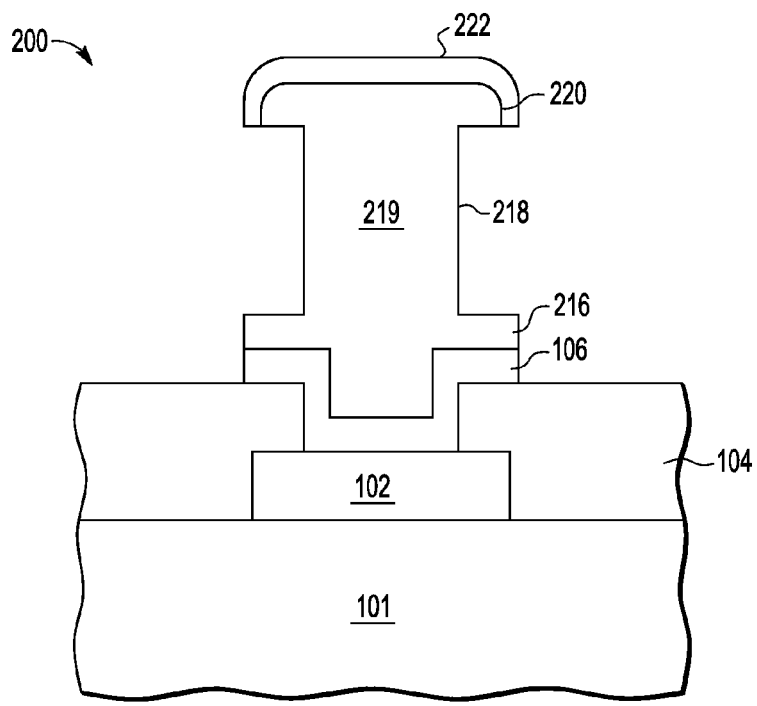

FIG. 16 shows semiconductor device 200 during a subsequent stage of manufacture during which photoresist layers 202, 210 are removed using a known technique such as solvents, or oxygen plasma processes. A portion of seed layer 106 is removed using a known technique such as etching. Another portion of seed layer 106 is left under the widest section 216 of interconnect 219. The height and width of section 218 of interconnect 219 is designed to allow interconnect 219 to bend under relatively low stress conditions, such as stresses that can occur during cooldown of interconnect 219 during the process of attaching interconnect 219 to a carrier or other suitable structure. The bending will lower the stress between interconnect 219 and underlying layers 106, 104, 102. After the connection between interconnect 219 and a carrier or other suitable structure is formed and the connected assembly is cooled down, the entire length and all elements of interconnect 219 can be reinforced with the underfill material around the sides of interconnect 219.

FIGS. 17-20 show another embodiment of a semiconductor device 300 during various stages of manufacture in accordance with the present invention.

Figure 17:
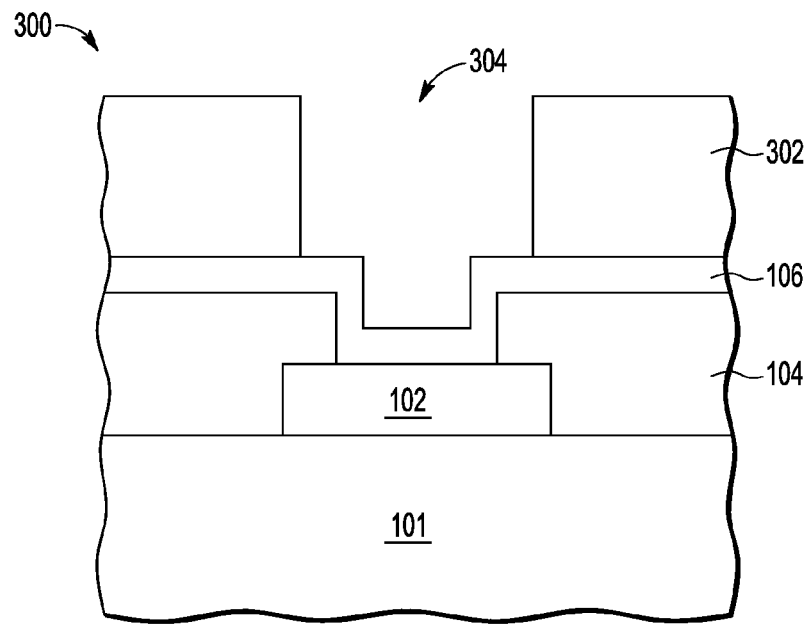
FIGS. 17-20 show another embodiment of a semiconductor device during subsequent stages of manufacture in accordance with the present invention.

FIG. 17 shows integrated circuit or semiconductor device 300 at an intermediate stage of manufacture during which bond pad 102, final passivation layer 104, and seed layer 106 have been formed using techniques similar to those described herein for semiconductor device 100 (FIG. 2).

Photoresist layer 302 is formed over seed layer 106 using dry film or a spin-on process at a thickness ranging from 20 to 100 microns. Other suitable formation or deposition techniques and thicknesses can be used for photoresist layer 302.

Opening 304 is formed in photoresist layer 302 with a larger width or diameter than opening 105 (FIG. 1) in passivation layer 104. Note that any suitable type of photoresist material can be used for photoresist layer 302 including negative or positive photoresist material.

Figure 18:
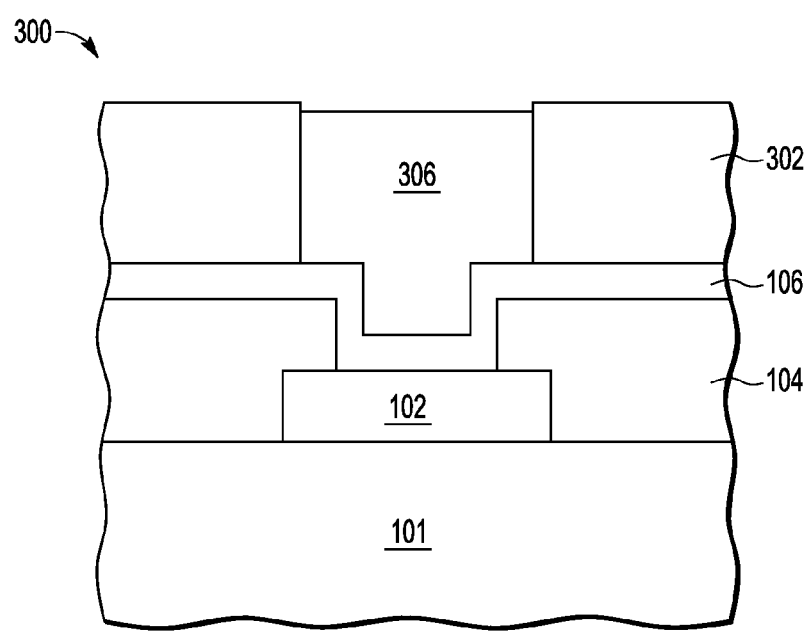

FIG. 18 shows semiconductor device 300 during a subsequent stage of manufacture during which a plating process is used to fill opening 304 (FIG. 17) with conductive material to form a first plating section 306. Plating section 306 is formed of any suitable conductive material or combination of conductive materials, such as copper, nickel, and/or gold. In some embodiments, plating section 306 is formed flush with or slightly below the top of photoresist layer 302.

Figure 19:
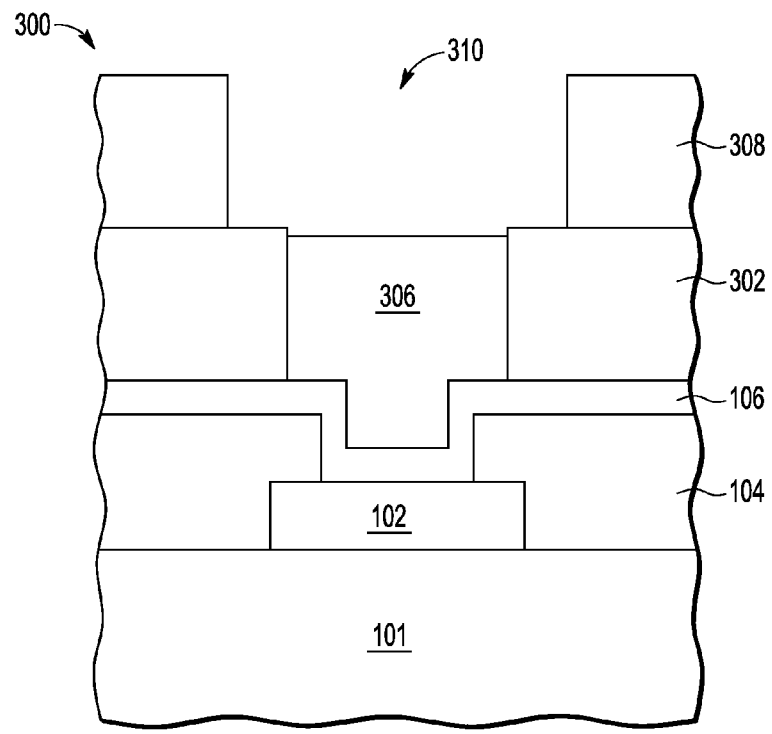

FIG. 19 shows semiconductor device 300 during a subsequent stage of manufacture during which a second photoresist layer 308 is formed adjacent to photoresist layer 302 and plating section 306 using dry film or a spin-on process at a thickness ranging from 20 to 100 microns. Other suitable formation or deposition techniques and thicknesses can be used for photoresist layer 308.

Opening 310 is formed in photoresist layer 308 with a larger width or diameter than plating section 306. Note that any suitable type of photoresist material can be used for photoresist layer 308 including negative or positive photoresist material.

Figure 20:
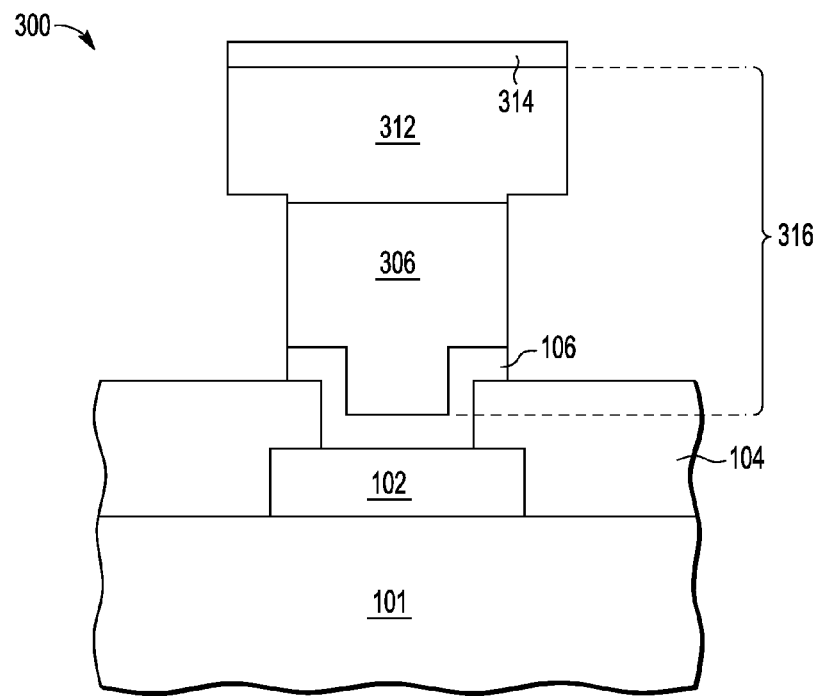

FIG. 20 shows semiconductor device 300 after a subsequent stage of manufacture in which a plating process is used to fill opening 310 (FIG. 19) with conductive material to form a second plating section 312. Plating section 312 is formed of any suitable conductive material or combination of conductive materials, such as copper, nickel, and/or gold. In some embodiments, plating section 312 is formed below the top of photoresist layer 308 (FIG. 19) to allow space to form a layer of solder finish 314 over plating section 312 within opening 310. Interconnect sections 306, 312 are collectively referred to as interconnect 316. Photoresist layers 302, 308 (FIG. 19) are then removed using a known technique such as solvents or oxygen plasma processes. The height and width of section 306 is designed to allow section 306 to bend under relatively low stress conditions, such as stresses that can occur during cooldown of device 300 after the process to connect device 300 to a chip carrier or other suitable structure. After the connection process, sections 306 and 312 can be reinforced with fill material around the surfaces of seed layer 106.

Figure 21:
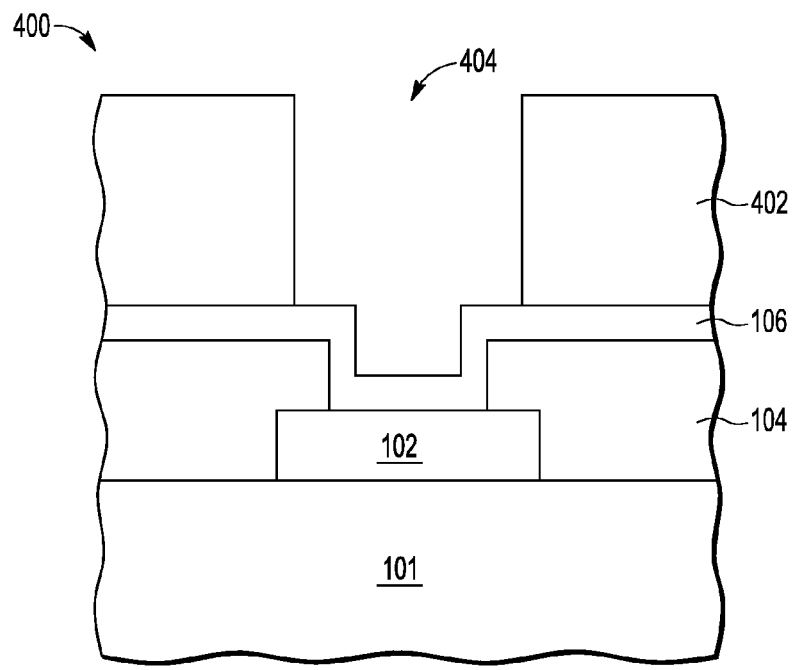
FIGS. 21-23 show another embodiment of a semiconductor device during subsequent stages of manufacture in accordance with the present invention.
Figure 22:
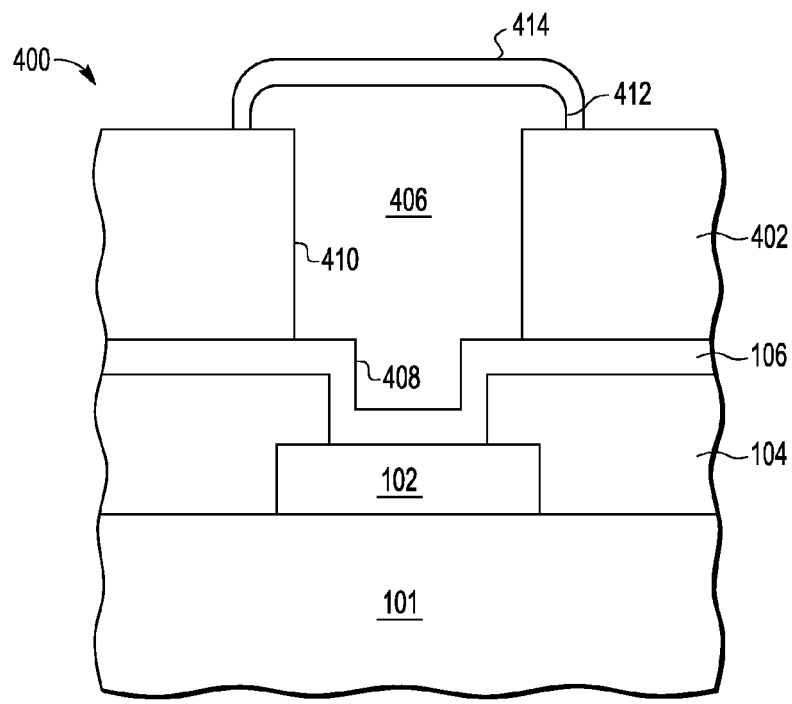
Figure 23:
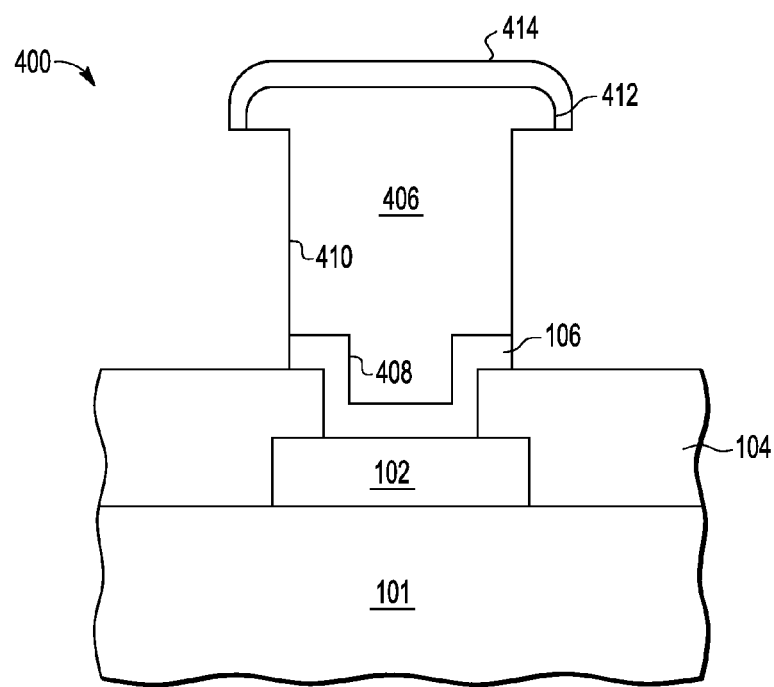

FIGS. 21-23 show another embodiment of a semiconductor device 400 during various stages of manufacture in accordance with the present invention.

FIG. 21 shows integrated circuit or semiconductor device 400 at an intermediate stage of manufacture during which bond pad 102, final passivation layer 104, and seed layer 106 have been formed using techniques similar to those described herein for semiconductor device 100 (FIGS. 1, 2).

Photoresist layer 402 is formed over seed layer 106 using dry film or a spin-on process at a thickness ranging from 20 to 100 microns. Other suitable formation or deposition techniques and thicknesses can be used for photoresist layer 402.

In one embodiment, opening 404 is formed in photoresist layer 402 with a larger width or diameter than opening 105 (FIG. 1) in passivation layer 104. In other embodiments, opening 404 could have a width or diameter the same as or smaller than opening 105. Note that any suitable type of photoresist material can be used for photoresist layer 402 including negative or positive photoresist material.

FIG. 22 shows semiconductor device 400 during a subsequent stage of manufacture during which a plating process is used to fill opening 404 (FIG. 21) with conductive material to form a interconnect 406. Interconnect 406 is formed of any suitable conductive material or combination of conductive materials, such as copper, nickel, and/or gold. Interconnect 406 is formed with a cap 412 that extends over a portion of the top of photoresist layer 402. Cap 412 may be formed with dimensions suited to establishing a conductive bond with another component mounted adjacent to interconnect 406. Solder finish 414 can be formed over and around the sides of cap 412. The height and width of section 410 is designed to allow section 410 to bend under relatively low stress conditions, such as stresses that can occur during cooldown of sections 406, 408, 412 during the process of attaching interconnect 219 to a carrier or other suitable structure.

FIG. 23 shows semiconductor device 400 after a subsequent stage of manufacture during which photoresist layer 402 (FIG. 22) is removed using a known technique such as solvents or oxygen plasma processes. A portion of seed layer 106 is removed using a known technique such as etching. Another portion of seed layer 106 is left under and around the sides of lower section 408, as well as under section 410, of interconnect 406. After interconnect 406 is attached to a carrier or other suitable structure and cooled, interconnect 406 can be reinforced with fill material around the sides of interconnect section 410.

Figure 24:
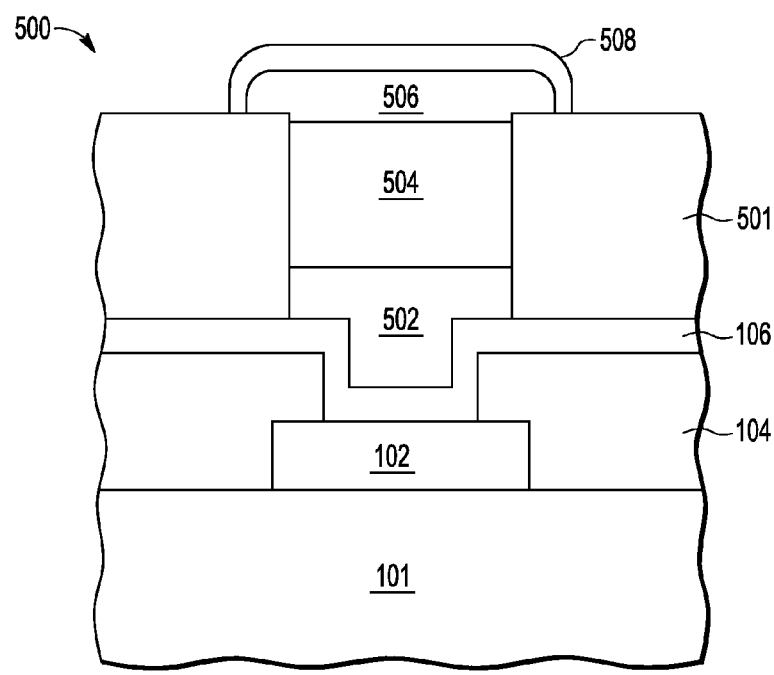
FIGS. 24-26 show another embodiment of a semiconductor device during subsequent stages of manufacture in accordance with the present invention.
Figure 25:
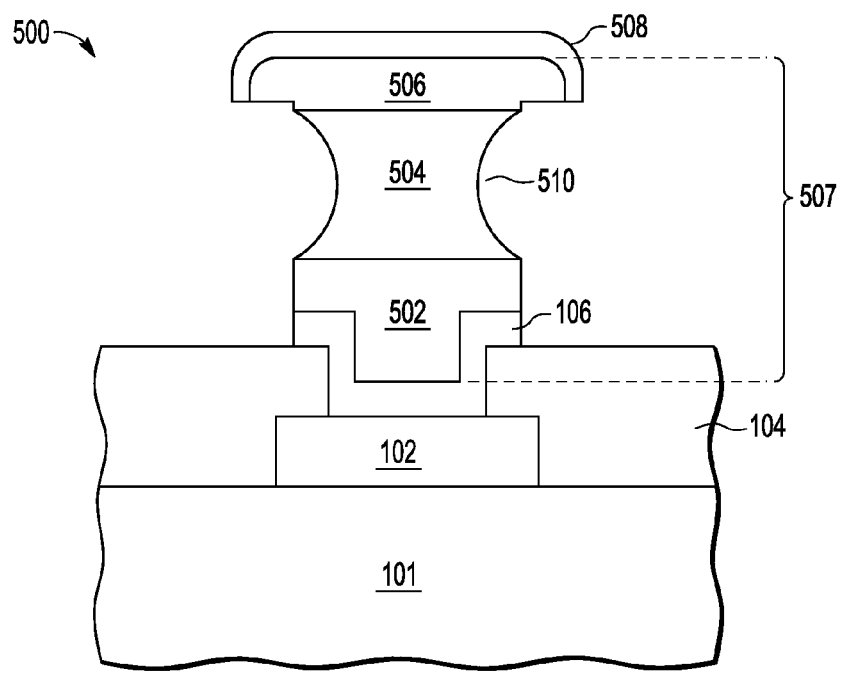
Figure 26:
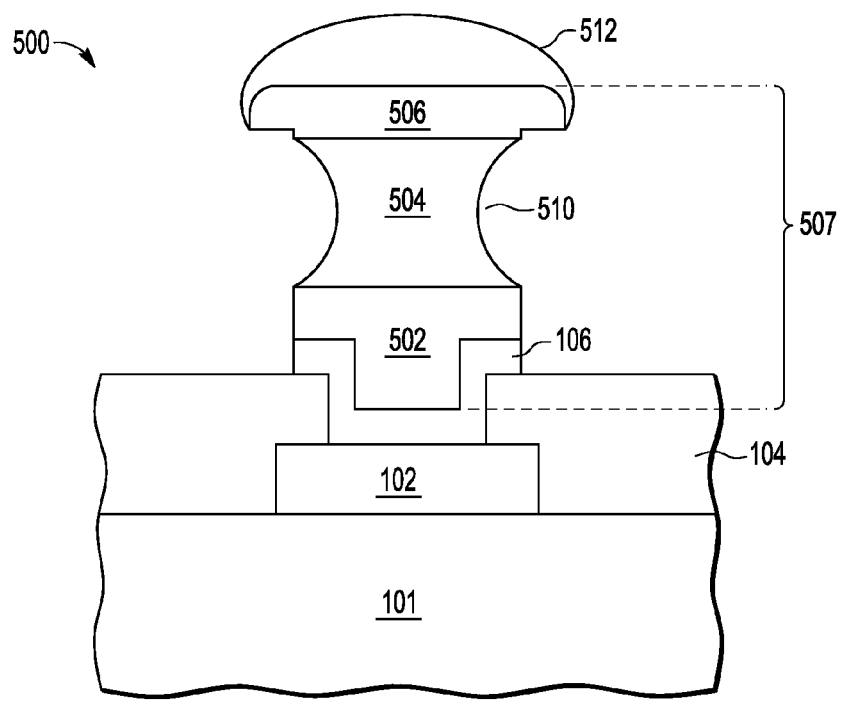

FIGS. 24-26 show another embodiment of a semiconductor device 500 during various stages of manufacture in accordance with the present invention.

FIG. 24 shows integrated circuit or semiconductor device 500 at an intermediate stage of manufacture during which bond pad 102, final passivation layer 104, and seed layer 106 have been formed using techniques similar to those described herein for semiconductor device 100.

Photoresist layer 501 is formed over seed layer 106 using dry film or a spin-on process at a thickness ranging from 20 to 100 microns. Other suitable formation or deposition techniques and thicknesses can be used for photoresist layer 501.

In one embodiment, an opening formed in photoresist layer 501 has a larger width or diameter than opening 105 (FIG. 1) in passivation layer 104. In other embodiments, the opening in photoresist layer 501 could have a width or diameter the same as or smaller than opening 105. Note that any suitable type of photoresist material can be used for photoresist layer 501 including negative or positive photoresist material.

A plating process is used to fill a first section 502 of the opening with conductive material that will be part of an interconnect. A second plating process is performed to fill a second section 504 of the opening with a second conductive material. A third plating process is performed to form a third section 506 of the interconnect that includes a cap extending over a portion of the top of photoresist layer 501.

Interconnect sections 502, 504, 506 (collectively, "interconnect 507") are formed of any suitable conductive material or combination of conductive materials, such as copper, nickel, and/or gold. For example, in some embodiments, section 502 is formed of nickel plating, section 504 is formed of copper plating, and section 506 is formed of nickel plating. Cap section 506 may be formed with dimensions suited to establishing a conductive bond with another component mounted adjacent to the interconnect. Solder finish 508 can be formed over and around the sides of cap 506.

FIG. 25 shows semiconductor device 500 after a subsequent stage of manufacture during which photoresist layer 501 (FIG. 24) is removed using a known technique such as solvents or oxygen plasma processes. A portion of seed layer 106 is removed using a known technique such as etching. Another portion of seed layer 106 is left under and around the sides of lower section 502, as well as under section 504, of the interconnect 507.

The side walls of section 504 can then be reduced to form concave portions 510 with gradually decreasing cross-section toward the center of section 504 (along the height of section 504). The concave portions can be formed by a selective etching process, or by other appropriate means. The height and concave portion 510 of section 504 is designed to allow bending in section 504 under relatively low stress conditions, such as stresses that can occur during cooldown of sections 502, 504, 506, and 106 during the process of attaching interconnect 506 to a carrier or other suitable structure.

FIG. 26 shows an embodiment of semiconductor device 500 after a subsequent stage of manufacture during which the entire semiconductor device can be reflowed and solder finish 508 (FIG. 25) is melted and cooled to form reflowed cap 512. Also note that the solder finish can be reflowed to create a reflowed cap in other embodiments of semiconductor devices 100, 200, 300, 400 and methods described herein.

Figure 27:
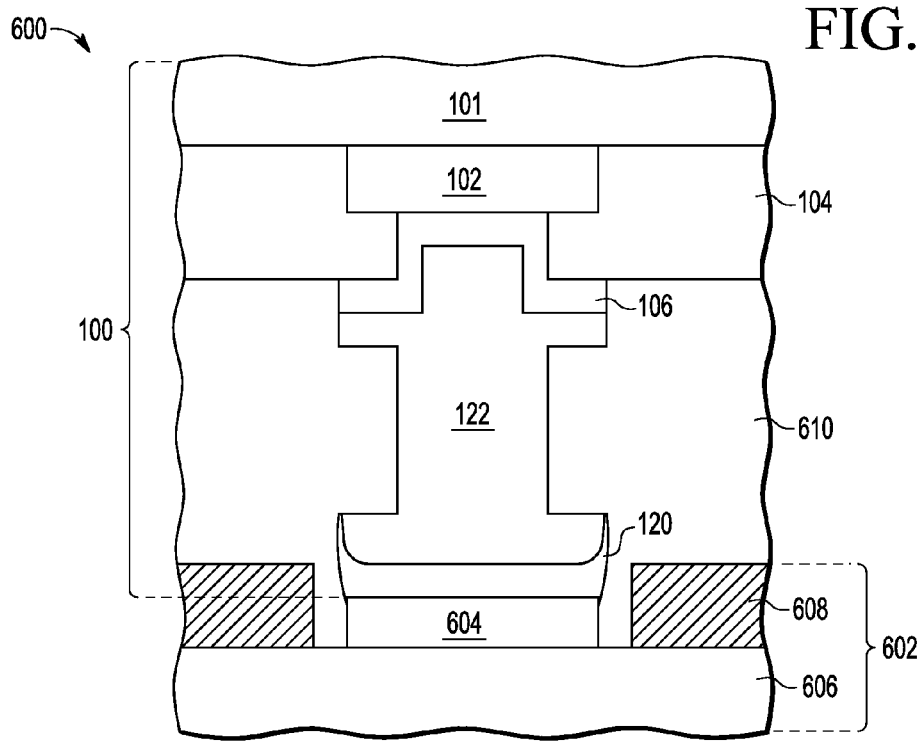
FIGS. 27-28 show an embodiment of a semiconductor device during subsequent phases of manufacture in accordance with the present invention.

FIG. 27 shows an assembly 600 of semiconductor device 100 (FIG. 8) connected or bonded to a bond pad 602 of a chip carrier 604 or other suitable structure. The carrier 601 can include a substrate dielectric layer 606 on which bond pad 602 is mounted and solder mask 608 is formed. The assembly 600 can be reinforced with fill material 610 around interconnect 122, and exposed portions of passivation layer and seed layer 106. Fill material 610 reinforces interconnect 122 while still allowing interconnect to bend during cooling after being attached to bond pad 602. Any suitable material can be used for fill material 610, such as a silica filled epoxy.

Figure 28:
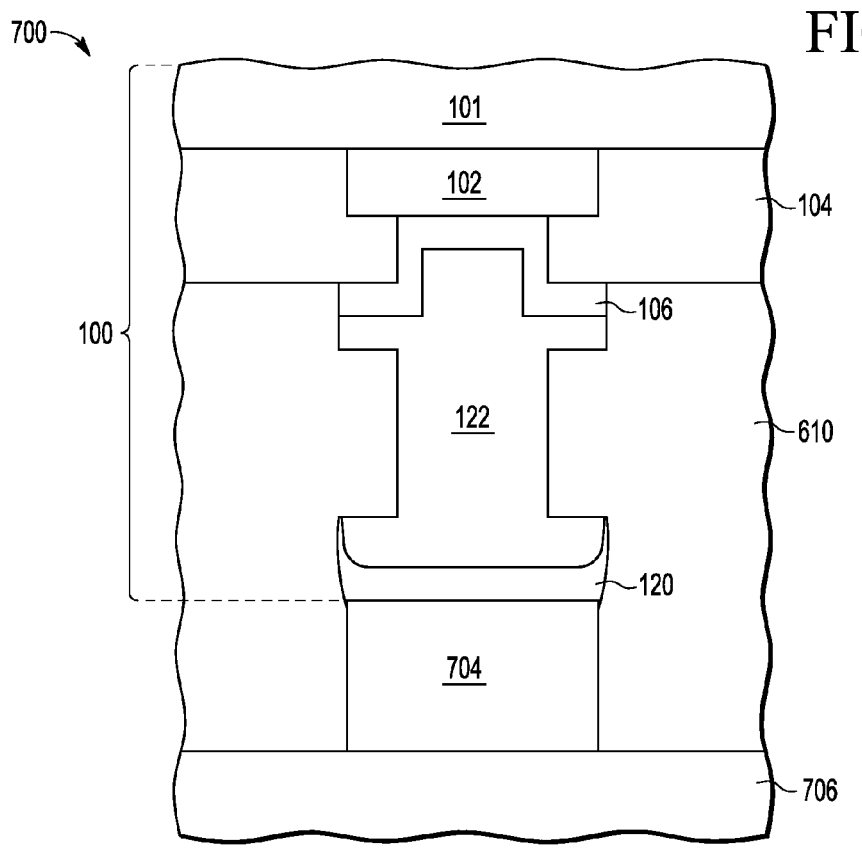

FIG. 28 shows an assembly 700 of semiconductor device 100 (FIG. 8) connected to a die 706 with microbumps 704. In the embodiment shown, solder finish 120 is bonded to microbump 704. The joined assembly 700 can be reinforced with fill material 610 around the sides of interconnect 122, and exposed portions of passivation layer and seed layer 106.

By now it should be appreciated that there has been provided embodiments of methods of forming a connecting pillar 122, 219, 316, 406, 507 to a bond pad 102 of an integrated circuit that can include forming a seed layer 106 over the bond pad 102; depositing photoresist 108 over the seed layer 106; forming an opening in the photoresist 108 over the bond pad 102; and forming the connecting pillar 122, 219, 316, 406, 507 in the opening by plating.

In one aspect, the step of forming the opening can be characterized by the opening having substantially the same diameter from a bottom of the opening to a top of the opening.

In another aspect, the method can further comprise etching back a portion of the connecting pillar 507 to reduce the diameter of a mid portion 504 of the connecting pillar 507.

In another aspect, forming the connecting pillar 507 can comprise changing materials from a first material to a second material during plating, wherein the second material is in the mid portion and reduced in diameter during the step of etching back.

In another aspect, forming the connecting pillar 122, 219, 316, 406, 507 can be further characterized by the connecting pillar 122, 219, 316, 406, 507 extending above the top of the opening.

In another aspect, the method can further comprise removing the photoresist 108; and removing a portion of the seed layer 106 using the connecting pillar 122, 219, 316, 406, 507 as a mask.

In another aspect, the step of depositing photoresist 108 can comprise forming a first photoresist 108 layer having a first opening 105 over the bond pad 102, wherein the first opening 105 has a first diameter; and after forming the first photoresist 108 layer, forming a second photoresist 112 layer having a second opening 113 over the bond pad 102, wherein second opening 113 has a second diameter less than the first diameter.

In another aspect, the step of forming the connecting pillar 122, 316, 507 can comprise plating 110 in the first opening 105 prior to the step of forming the second photoresist 112 layer.

In another aspect, the step of forming the connecting pillar 122, 316, 507 can comprise plating in the second opening 113.

In another aspect, the step of depositing photoresist 108 can comprise: forming a first photoresist 108 layer having a first opening 105 over the bond pad 102, wherein the first opening 105 has a first diameter; and after forming the first photoresist 108 layer, forming a second photoresist 112 layer having a second opening 113 over the bond pad 102, wherein second opening 113 has a second diameter greater than the first diameter.

In another aspect, the step of forming the connecting pillar 122, 316, 507 can comprise changing a material being plated so that material plated above the second photoresist 112 layer is a different material than material plated in the first opening 105.

In another aspect, the method can further comprise plating a top of the connecting pillar 122, 219, 316, 406, 507 with solder.

In another aspect, the step of depositing photoresist 108 can comprise depositing a layer of photoresist 108; exposing a portion of the photoresist 108 in a pattern of an area over the bond pad 102; and applying a hardener 206 to harden a top portion of the photoresist 108. The step of forming the opening comprises opening the area over the bond pad 102 and laterally extending the area over the bond pad 102 in a region below the top portion of the photoresist 108;

In another embodiment, a semiconductor device can comprise a bond pad 102; a seed layer 106 on the bond pad 102; and a connecting pillar 122, 219, 316, 406, 507 on the seed layer 106 within a perimeter of the bond pad 102. The connecting pillar 122, 219, 316, 406, 507 can have a main body connected to the seed layer 106 and a cap 116, 220, 412, 506. The cap 116, 220, 412, 506 can comprise solder on a top of the cap and a first region comprising a first metal. The first region can be between the solder and the main body. The first metal can be different from solder; and the cap 116, 220, 412, 506 and the first metal can extend laterally outside a perimeter of the main body where the main body is adjacent to the first metal.

In another aspect, the body and the first metal comprise copper.

In another aspect, the main body has lower portion and a mid portion, wherein the mid portion is between the lower portion and the cap 116, 220, 412, 506 and the lower portion has at least a first diameter, wherein a minimum diameter of the mid portion is less than the first diameter.

In another aspect, the main body has a first portion comprising a first material and a second portion comprising a second material different from the first material.

In another aspect, one of the first material and the second material can be the same as the first metal.

In another embodiment, a method of forming a connecting pillar 122, 219, 316, 406, 507 on a bond pad 102 of integrated circuit can comprise forming a seed layer 106 on the bond pad 102; depositing and patterning photoresist 108 to provide an opening for conductive material; forming the conductive layer in the opening using plating including forming a cap layer 116, 220, 412, 506 extending past a top of the opening, wherein the cap comprises solder and a first material between the between the solder and the top of the opening, wherein the cap has a greater diameter than the top of the opening; and removing the photoresist 108.

In another aspect, the step of forming the conductive layer comprises forming a first material followed by forming a second material different from the first material before forming the cap.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, openings 109 (FIG. 2), 304 (FIG. 17) can be formed in photoresist layer 302 with the same or smaller width or diameter as opening 105 (FIG. 1) in passivation layer 104. As another example, the term "interconnect" can also be referred to as a pillar. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The semiconductor substrate used in with the semiconductor device disclosed herein can be any semiconductor material or combinations of materials, such as gallium arsenide, silicon germanium, silicon-on-insulator (SOI), silicon, monocrystalline silicon, the like, and combinations of the above.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a connecting pillar to a bond pad of an integrated circuit:
   forming a seed layer over the bond pad;
   depositing photoresist over the seed layer;
   forming a first opening in the photoresist over the bond pad, wherein a largest cross-sectional diameter of the first opening is within a perimeter of the bond pad and the first opening has substantially the same diameter from a bottom of the first opening to a top of the first opening;
   forming a lower portion of a connecting pillar in the first opening by plating, wherein the lower portion is in contact with the seed layer;
   forming a second photoresist layer having a second opening over the bond pad;
   forming a mid portion of the connecting pillar in the second opening by plating, wherein the mid portion is in contact with the lower portion, the mid portion has a cross-sectional diameter that is less than a smallest cross-sectional diameter of the lower portion;
   forming a cap portion by allowing plating to overflow sides of the second opening, the cross-sectional diameter of the mid portion is less than a cross-sectional diameter of the cap portion.

2. The method of claim 1, further comprising etching back a central portion of the connecting pillar to reduce the diameter of the mid portion of the connecting pillar.

3. The method of claim 2, wherein forming the connecting pillar comprises changing materials from a first material to a second material during plating, wherein the second material is in the mid portion and reduced in diameter during the step of etching back.

4. The method of claim 1, wherein the step of forming the connecting pillar is further characterized by the connecting pillar extending above the top of the first opening.

5. The method of claim 4, further comprising:
   removing the photoresist; and
   removing a portion of the seed layer using the connecting pillar as a mask.

6. The method of claim 1, wherein
   the second opening has a second diameter less than the first diameter.

7. The method of claim 6, wherein the step of forming the connecting pillar comprises plating in the first opening prior to the step of forming the second photoresist layer.

8. The method of claim 7, wherein the step of forming the connecting pillar comprises plating in the second opening.

9. The method of claim 1, wherein the step of forming the connecting pillar comprises changing a material being plated so that material plated above the second photoresist layer is a different material than material plated in the first opening.

10. The method of claim 1, further comprising plating a top of the connecting pillar with solder.

11. The method of claim 1, wherein the step of depositing photoresist comprises:
   depositing a layer of photoresist;
   exposing a portion of the photoresist in a pattern of an area over the bond pad; and
   applying a hardener to harden a top portion of the photoresist;

wherein the step of forming the opening comprises opening the area over the bond pad and laterally extending the area over the bond pad in a region below the top portion of the photoresist.

* * * * *